United States Patent [19]
Kudo

[11] Patent Number: 5,610,763
[45] Date of Patent: Mar. 11, 1997

[54] ILLUMINATING OPTICAL APPARATUS

[75] Inventor: Yuji Kudo, Kawasaki, Japan

[73] Assignee: Nikon Corporation, Tokyo, Japan

[21] Appl. No.: 668,829

[22] Filed: Jun. 24, 1996

Related U.S. Application Data

[63] Continuation of Ser. No. 139,810, Oct. 22, 1993, abandoned.

[30] Foreign Application Priority Data

Oct. 22, 1992 [JP] Japan ................................. 4-284226
May 31, 1993 [JP] Japan ................................. 5-128641

[51] Int. Cl.$^6$ .......................... G02B 27/10; F21V 29/00; F21V 7/04; G03B 27/72
[52] U.S. Cl. ......................... 359/619; 362/268; 362/32; 355/67; 355/71
[58] Field of Search ........................ 359/619, 621, 359/622; 355/71, 67; 362/268, 227, 241, 327, 328, 331, 32

[56] References Cited

U.S. PATENT DOCUMENTS

| | | | |
|---|---|---|---|
| 2,183,249 | 12/1939 | Schering et al. | 359/621 |
| 3,296,923 | 1/1967 | Miles | 359/621 |
| 4,683,524 | 7/1987 | Ohta | 362/268 |
| 4,744,615 | 5/1988 | Fan et al. | 350/96.1 |
| 4,789,222 | 7/1988 | Ota et al. | 359/619 |
| 4,851,978 | 7/1989 | Ichihara | 359/619 |
| 4,918,583 | 4/1990 | Kudo et al. | 362/268 |
| 4,931,830 | 6/1990 | Suwa et al. | 355/71 |
| 4,988,188 | 1/1991 | Ohta | 359/619 |
| 5,098,184 | 3/1992 | van den Brandt et al. | 359/622 |
| 5,153,773 | 10/1992 | Muraki et al. | 359/619 |
| 5,251,067 | 10/1993 | Kamon | 359/619 |
| 5,307,206 | 4/1994 | Ichihana | 359/622 |

FOREIGN PATENT DOCUMENTS 61-91662 5/1986 Japan.
4-101148 4/1992 Japan.

*Primary Examiner*—Georgia Y. Epps
*Assistant Examiner*—Ricky Mack
*Attorney, Agent, or Firm*—Shapiro and Shapiro

[57] ABSTRACT

An illuminating optical apparatus for performing, e.g., oblique illumination has an arrangement in which an image of a reflecting mirror for reflecting a light beam from a light source is formed while being curved. With this arrangement, an annular secondary source with a light intensity distribution having moderate tails can be obtained.

12 Claims, 8 Drawing Sheets

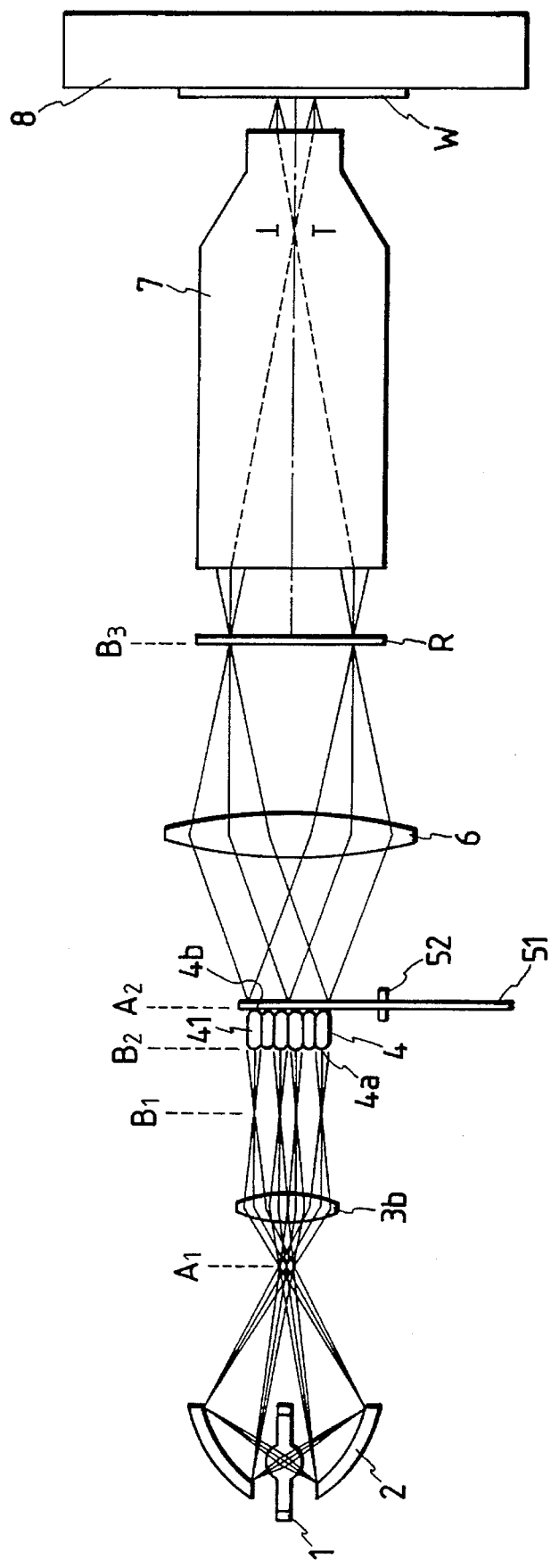

ILLUMINATING OPTICAL APPARATUS

This is a continuation of application Ser. No. 08/139,810, filed Oct. 22, 1993, now abandoned.

BACKGROUND OF THE INVENTION

1. Field of the Invention

The present invention relates to an illuminating optical apparatus for uniformly illuminating a target surface and, more particularly, to an illuminating optical apparatus suitable for a semiconductor manufacturing exposure apparatus.

2. Related Background Art

An illuminating optical apparatus applied to a semiconductor exposure apparatus, as shown in FIG. 12, is, for example, known as a conventional illuminating optical apparatus. As shown in FIG. 12, a light beam from a light source 1 such as a mercury arc lamp is focused by an elliptical mirror 2 through a reflecting mirror $M_1$ and converted into a parallel beam through a collimator lens 3. The parallel beam is guided to a fly-eye lens 4. When the parallel beam passes through the fly-eye lens 4, a secondary source consisting of a plurality of secondary light source images is formed. The beams from this secondary source are focused by a condenser lens 6 through a reflecting mirror $M_2$ and uniformly illuminate a reticle R as a target object so as to superpose the secondary images.

With the arrangement of the above illuminating optical apparatus, a circuit pattern formed on the reticle R is reduced and projected on a wafer W placed on a wafer stage 8 by a projecting optical system 7.

In recent years, strong demand has arisen for transferring a micropattern on a wafer. For this purpose, the resolution of the projecting optical system can be increased. To increase the resolution of the projecting optical system, a technique for shortening the wavelength of an illuminating light source and a technique for increasing the numerical aperture of the projecting optical system are available.

When the wavelength of the illuminating light source is shortened, an appropriate optical material which can be used as a light-transmitting optical member is not accessible. It is difficult to arrange a short-wavelength projecting optical system.

When the numerical aperture of the projecting optical system is increased, the focal depth is decreased in proportion to the square of this numerical aperture. The resolution of the state-of-the-art projecting optical system has almost a limit value.

Under these circumstances at a deadlock, an oblique illumination technique has recently been proposed and received a great deal of attention. As shown in FIG. 12, the shape of a secondary source formed on the exit side of the fly-eye lens 4 is deformed to obliquely illuminate a reticle R, thereby greatly increasing the resolution and focal depth inherent to the projecting optical system 7.

For example, an annular illumination method is known to increase the resolution and focal depth. An annular (doughnut-like) aperture is formed in an aperture stop 5 located on the exit side of the fly-eye lens 4 to form an annular secondary source, as shown in FIG. 12. A light beam from the annular secondary source obliquely illuminates the reticle R.

A special oblique illumination method is also known, as disclosed in Japanese Laid-Open Patent Application No. 4-101148. According to this technique, two or four apertures are formed in an aperture stop 5 to form two or four secondary sources, as shown in FIG. 12. Light beams from these secondary sources obliquely illuminate the reticle R to obtain a higher resolution and a larger focal depth than those of the annular illumination method.

The above oblique illumination techniques have advantages in that the resolution and focal depth inherent to a projecting optical system can be greatly increased. However, the light beam must be greatly shielded by an aperture stop arranged on the exit side of a fly-eye lens, thereby greatly reducing the illumination efficiency. As a result, the throughput is greatly decreased, resulting in a serious problem.

SUMMARY OF THE INVENTION

The present invention, therefore, has been made to solve all the conventional problems described above, and has as an object to provide a simple, high-performance illuminating optical apparatus capable of maintaining a high illumination efficiency.

In order to achieve the above object, according to a first aspect of the present invention, there is provided an illuminating optical apparatus comprising a light source for supplying a light beam; a reflecting mirror for reflecting and focusing said light beam, said reflecting mirror having an aperture with a predetermined shape and being rotationally symmetric with respect to an optical axis; a collimating optical system for collimating the light beam reflected and focused by said reflecting mirror into a substantially parallel light beam; multiple light source image forming means for forming a plurality of secondary light source images from said substantially parallel light beam; and a condenser optical system for condensing light from said secondary light source images to uniformly illuminate a target object, wherein said collimating optical system forms an image of a reflection region nearest said aperture of said reflecting mirror on a predetermined surface of said multiple light source image forming means and forms an image of a reflection region farthest from said aperture of said reflecting mirror at a position far from said predetermined surface of said multiple light source image forming means with respect to the direction of the optical axis.

In order to achieve the above object, according to a second aspect of the present invention, there is provided an illuminating optical apparatus comprising a light source for supplying a light beam; a reflecting mirror for reflecting and condensing said light beam, said reflecting mirror having an aperture with a predetermined shape and being rotationally symmetric with respect to an optical axis; a re-imaging optical system for re-imaging a light source image formed by said light beam reflected and condensed by said reflecting mirror; multiple light source image forming means having an incidence surface located at a position of said light source image for forming a plurality of secondary light source images; a focusing optical system for focusing light from said plurality of secondary light source images; and a condenser optical system for condensing the focused light from said focusing optical system to uniformly illuminate a target object, wherein said re-imaging optical system forms an image of a reflection region nearest said aperture of said reflecting mirror on a predetermined surface of said multiple light source image forming means and forms an image of a reflection region farthest from said aperture of said reflecting mirror at a position far from said predetermined surface of said multiple light source image forming means with respect to the direction of the optical axis.

According to the present invention, an image of the reflection surface of the rotationally symmetric reflecting mirror, which image is formed at a position conjugate to the target surface in the illuminating optical apparatus (position of a pupil in the illuminating optical apparatus) or near that position, is positively curved, thereby forming the plurality of secondary source images by the multiple light source image forming means while obtaining an annular light intensity distribution having no peak point at the peripheral portion of the secondary source images without generating the sharp edge of the image of the peripheral reflection region farthest from the aperture of the rotationally symmetric reflecting mirror.

According to the first aspect of the present invention, the image of the reflection surface of the rotationally symmetric reflecting mirror is curved, which image is formed by the collimating optical system, and the collimating optical system forms the image of the reflection region nearest the aperture of the rotationally symmetric reflecting mirror on the predetermined surface of the multiple light image forming means and forms the image of the peripheral reflection region farthest from the aperture of the rotationally symmetric reflecting mirror at the position far from the predetermined surface of the multiple light image forming means, thereby forming the secondary source images by the multiple light source forming means while obtaining an annular light intensity distribution moderate at the peripheral portion of the secondary source images.

According to the second aspect of the present invention, the image of the reflection surface of the rotationally symmetric reflecting mirror is curved, which image is formed by the re-imaging optical system, and the re-imaging optical system forms the image of the reflection region nearest the aperture of the rotationally symmetric reflecting mirror on the predetermined surface image of the multiple light source forming means and forms the image of the peripheral reflection region farthest from the aperture of the rotationally symmetric reflecting mirror at the position far from the predetermined surface of the multiple light source image forming means, thereby forming secondary source images again by cooperation of the multiple light source image forming means and the focusing optical system while obtaining an annular light intensity distribution moderate at the peripheral portion of the secondary source images.

With these arrangements, annular illumination can be achieved in principle without causing a loss in light amount. When two or four apertures are formed in an aperture stop, special oblique illumination at a much higher illumination efficiency than that of the conventional system can be achieved.

According to the present invention using the above arrangements, an annular secondary source light distribution at a very high illumination efficiency can be formed in principle without causing a loss in light amount while realizing a very simple system.

Especially, when the present invention is applied to a semiconductor manufacturing exposure apparatus, a reticle as a target object can be uniformly obliquely illuminated at a very high illumination efficiency. Therefore, a micropattern can be transferred to a wafer at a very high throughput.

According to the present invention, slight improvement in the conventional apparatus can provide a great effect.

According to a third aspect of the present invention, there is provided an illuminating optical apparatus comprising a light source for supplying a light beam; reflecting means for reflecting said light beam, said reflecting means having a reflection region with a predetermined shape and a non-reflection region with a predetermined shape and being rotationally symmetric with respect to an optical axis; light source image forming means for forming a light source image having a predetermined shape based on the light beam reflected from said reflecting means; and condenser means for condensing light from said light source image to uniformly illuminate a target, wherein said light source image forming means includes a focusing optical system for forming an image of said reflection region nearest said non-reflection region on a predetermined surface of said light source image forming means and forming an image of said reflection region farthest from said non-reflection region at a position far from said predetermined surface with respect to the direction of the optical axis.

According to the present invention, the image of the rotationally symmetric reflection surface, which image is formed in the illuminating optical apparatus, is positively curved, thereby forming the secondary light source images by the light source image forming means while obtaining an annular light intensity distribution having no peak point at the peripheral portion of the secondary light source images without generating the sharp edge of the image of the peripheral reflection region farthest from the light-transmitting portion of the rotationally symmetric reflecting means.

With the above arrangement, annular illumination can be achieved in principle without causing a loss in light amount. When two or four apertures are formed in an aperture stop, special oblique illumination at a much higher illumination efficiency than that of the conventional system can be achieved.

According to the a fourth aspect of the present invention, there is provided an illuminating optical apparatus comprising a light source for supplying a light beam; reflecting means for reflecting said light beam, said reflecting means having a non-reflection region with a predetermined shape and a reflection region with a predetermined shape and being rotationally symmetric with respect to an optical axis; light source image forming means for forming images of said non-reflection region and said reflection region based on the light beam reflected from said reflecting means and forming a light source image having a predetermined shape based on light from said image of said reflection region; and condenser means for condensing light from said light source image having the predetermined shape to uniformly illuminate a target object, wherein said light source image forming means variably sets an image forming state of said image of said non-reflection region.

According to the present invention, the image forming state of the image of the rotationally symmetric reflection surface, which image is formed in the illuminating optical apparatus, is variably set, thereby switching normal illumination and oblique illumination at a very high illumination efficiency. Especially, when the present invention is applied to a semiconductor manufacturing exposure apparatus, normal illumination and oblique illumination can be switched in a single exposure apparatus at a very high illumination efficiency.

Other objects, features, and advantages of the present invention will be apparent from the following embodiments.

BRIEF DESCRIPTION OF THE DRAWINGS

FIG. 10B is a view showing an arrangement in a normal illumination state according to the third embodiment of the present invention;

DETAILED DESCRIPTION OF THE PREFERRED EMBODIMENTS

Preferred embodiments of the present invention will be described with reference to the accompanying drawings.

Figure 1:
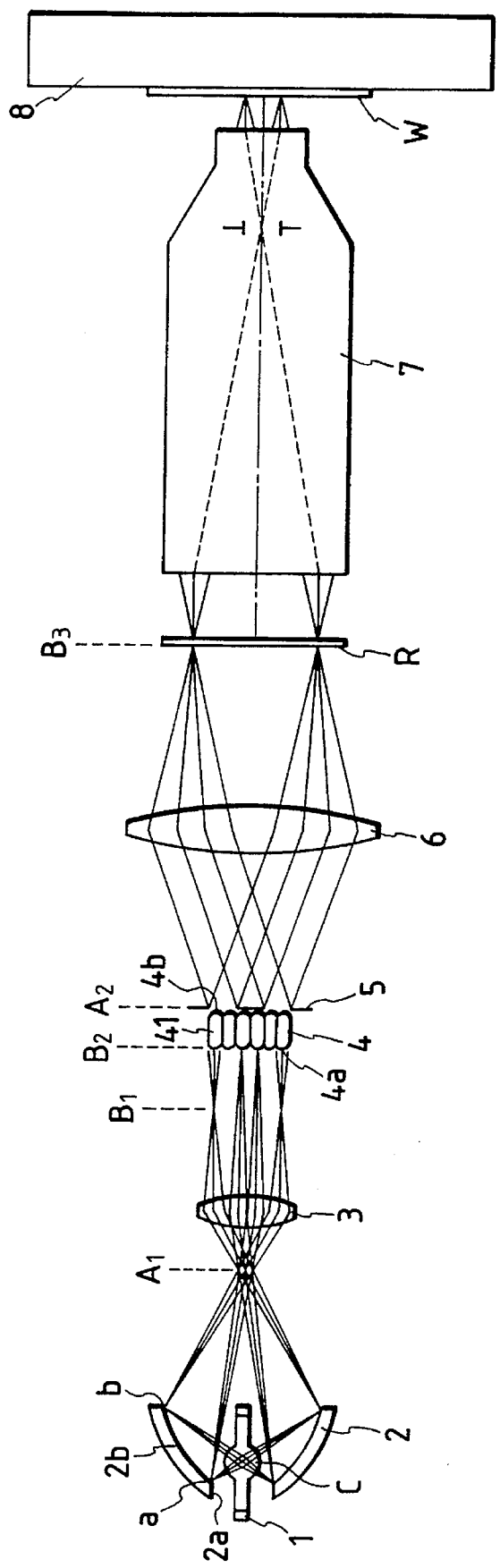
FIG. 1 is a view showing an arrangement according to the first embodiment of the present invention.
Figure 12:
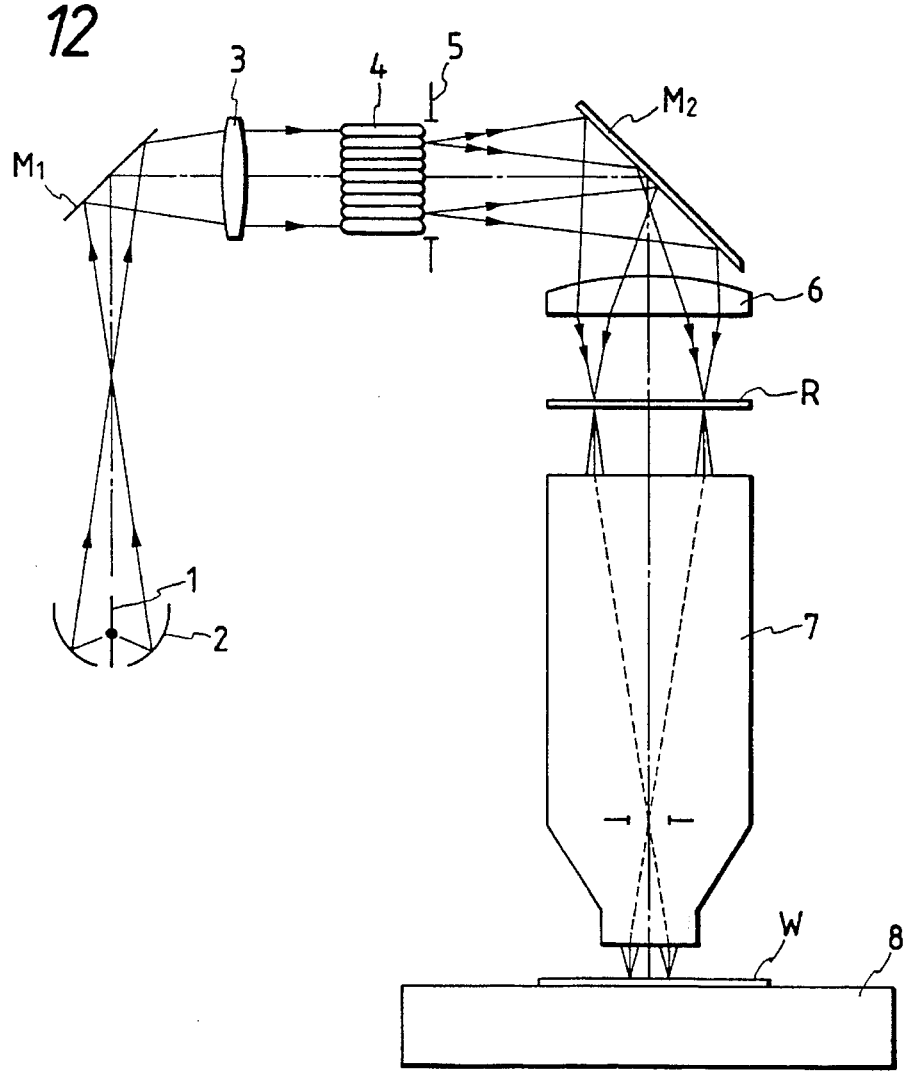
FIG. 12 is a view showing an arrangement of a conventional apparatus.

FIG. 1 shows an illuminating optical apparatus of the present invention which is applied to a semiconductor manufacturing exposure apparatus as the first embodiment. The same reference numerals as in FIG. 12 denote the same parts in FIG. 1. The first embodiment will be described in detail with reference to FIG. 1 below.

A light source 1 such as a mercury arc lamp for emitting a light beam such as a g-ray (436 nm) or i-ray (365 nm) is arranged almost at a first focal position c of an elliptical mirror 2 serving as a rotationally symmetrical reflecting mirror. The light beam from the light source 1 is reflected and focused by the elliptical mirror 2 having a circular aperture 2a and an elliptical reflection surface 2b, thereby forming a light source image of the light source 1 at a second focal position $A_1$ of the elliptical mirror 2.

Figure 2:
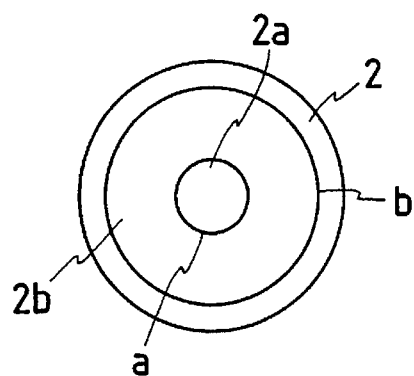
FIG. 2 is a view showing a state in which an elliptical mirror is viewed from the second focal point side.

FIG. 2 shows a state in which the elliptical mirror 2 is viewed from the second focal point side. A reflection region at a reflection position a nearest the aperture 2a shown in FIG. 1 and a reflection region at a reflection position b farthest from the aperture 2a have ring-like shapes, as shown in FIG. 2. Note that the aperture 2a of the elliptical mirror 2 may have any shape other than a circular shape.

Figure 3:
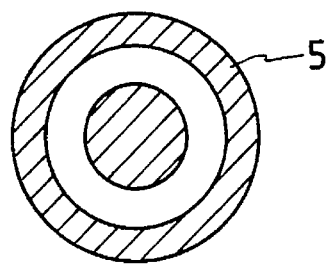
FIG. 3 is a plan view showing a state in which an annular aperture is formed in an aperture stop.

A light beam forming the light source image at the second focal position $A_1$ by the focusing function of the elliptical mirror 2 is collimated into a parallel beam by a collimator lens 3 serving as a collimating optical system whose front focal point is located at the light source image position $A_1$. This parallel beam passes through a fly-eye lens 4 serving as a multiple light source forming means and forms a plurality of light source images serving as a secondary source at a position $A_2$ on the exit surface side of the fly-eye lens 4. An aperture stop 5 having an annular (doughnut-like) aperture, as shown in FIG. 3, is located at the position $A_2$ where the plurality of light source images are formed.

The fly-eye lens 4 is a lens array constituted by a plurality of lens elements 41 each having a circular or polygonal (square or hexagonal) cross-section. The plurality of light source images are formed on or near the exit surface of the fly-eye lens 4, thereby forming substantially a secondary source. In this embodiment, each lens element 41 has a double-convex shape. However, the lens element 41 may have a plano-convex, meniscus, or double-concave shape. The lens elements 41 may be bundled in a doughnut-like shape to constitute the fly-eye lens 4.

Figure 4:
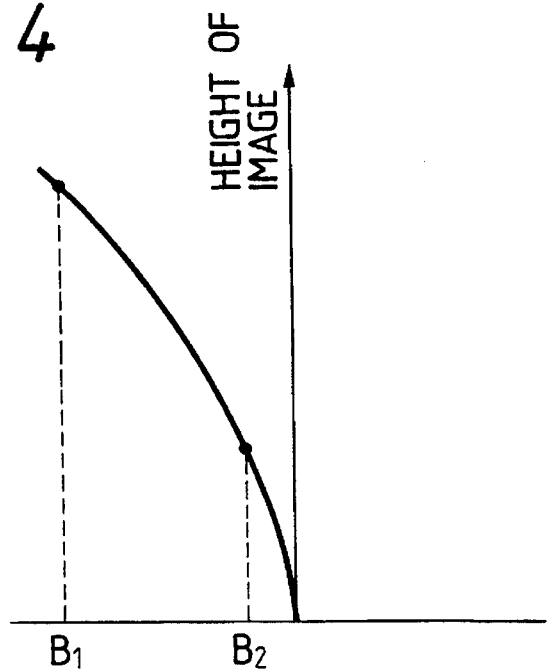
FIG. 4 is a graph showing an image forming position on the reflection surface of the elliptical mirror, which image is formed by a collimator lens of the first embodiment.

The collimator lens 3 has a function of curving an image of the reflection surface 2b of the elliptical mirror 2, which image is formed by the collimator lens 3 between position $B_2$ of an incident surface 4a of the fly-eye lens 4, and a position B, as indicated by the image forming positions of the reflection surface 2b of the elliptical mirror 2 in FIG. 4. Using this function, the collimator lens 3 focuses a light beam reflected by the ring-like reflection region nearest the aperture of the elliptical mirror 2 to form an image at the position $B_2$ of the incident surface of the fly-eye lens 4. The image of the ring-like reflection region a is formed at the position $B_2$ of the incident surface of the fly-eye lens 4. At the same time, the collimator lens 3 focuses a light beam reflected by a ring-like peripheral reflection region b farthest from the aperture 2a of the elliptical mirror 2 to form an image at a position $B_1$ far from the position $B_2$ of the incident surface of the fly-eye lens 4 along the optical axis. Therefore, the image of the ring-like reflection region b is formed at the position $B_1$ far from the position $B_2$ of the incident surface of the fly-eye lens 4 along the optical axis.

Figure 5A:
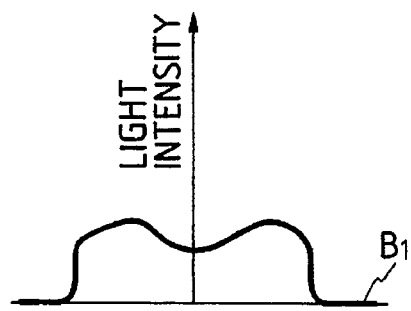
FIG. 5A is a graph showing a light intensity distribution at a position where an image of a ring-like reflection region farthest from the aperture of the elliptical mirror is formed by the collimator lens of the first embodiment.
Figure 5B:
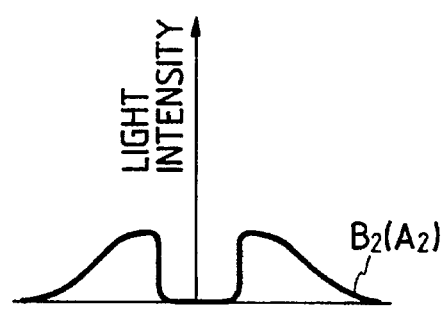
FIG. 5B is a graph showing a light intensity distribution at a position where an image of the ring-like region near the aperture of the elliptical mirror is formed by the collimator lens of the first embodiment.

As a result, the light beam at the position $B_1$ where the image of the ring-like reflection region b farthest from the aperture 2a of the elliptical mirror is formed by the collimator lens 3 has a light intensity distribution whose central portion is depressed, as shown in FIG. 5A. The light beam at the position $B_2$ where the image of the ring-like reflection region a nearest the aperture 2a of the elliptical mirror 2 is formed by the collimator lens 3 becomes an annular light beam having a light intensity distribution having the hollow center and moderate tails, as shown in FIG. 5B. The plurality of secondary light source images formed at the exit position $A_2$ of the fly-eye lens 4 also have substantially the light intensity distribution having the hollow center and the moderate tails, as shown in FIG. 5B. This light intensity can maximize the effect (to be described later) of the fly-eye lens 4 for illuminance uniformity at a reticle R as a target object. The secondary light source images formed by the fly-eye lens 4 form an annular secondary light source having a size corresponding to the size of the annular aperture of the aperture stop 5.

Figure 5C:
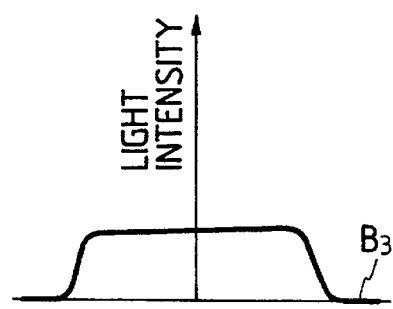
FIG. 5C is a graph showing a light intensity distribution on a reticle.

The annular light from this annular secondary source passes through the aperture stop 5 and is focused by a condenser lens 6 serving as a condenser optical system to obliquely illuminate the reticle R as the target object so as to superpose secondary light source images. In this case, the light intensity distribution on the reticle R becomes uniform, as shown in FIG. 5C. It is readily understood that the reticle R is uniformly illuminated.

The reticle R is held on a reticle stage (not shown), and a wafer W serving as a projecting target is placed on a two-dimensionally driven wafer stage 8. The reticle R is conjugate to the wafer W with respect to a projecting optical system 7. When the reticle R is uniformly illuminated, a predetermined circuit pattern formed on the reticle is reduced and projected on the wafer W by the projecting optical system 7, thereby transferring a circuit pattern image to the wafer W.

As described above, according to the first embodiment, since the annular secondary source can be directly formed without shielding the light beam, annular illumination at a very high illumination efficiency can be achieved. A micropattern can be transferred to the wafer W at a larger focal depth while realizing a high throughput.

According to the first embodiment, the aperture stop 5 having the annular aperture shown in FIG. 3 is provided. However, for example, an aperture stop 50 having four circular apertures shown in FIG. 6 may be provided in place of the aperture stop 5. In this case, special oblique illumination at a higher illumination efficiency than that of the conventional system can be achieved.

Figure 7:
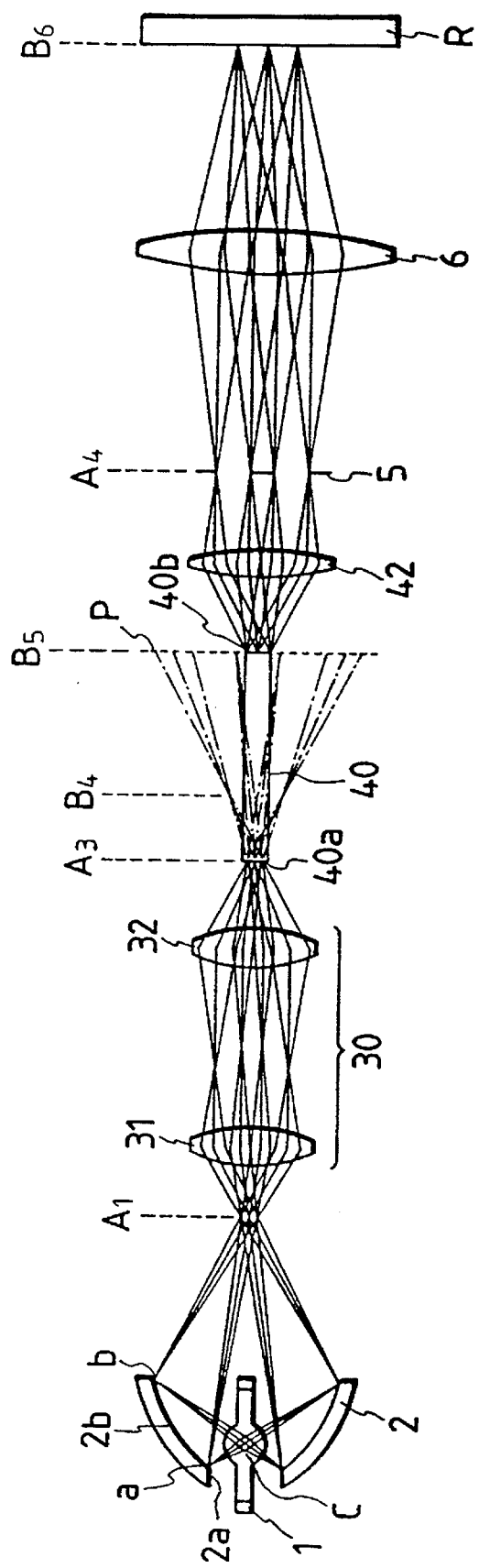
FIG. 7 is a view showing an arrangement according to the second embodiment of the present invention.

The second embodiment of the present invention will be described below with reference to FIG. 7. The second embodiment shown in FIG. 7 shows an illuminating optical apparatus suitable for a semiconductor manufacturing exposure apparatus. The same reference numerals as in FIG. 1 denote the same parts in FIG. 7.

The second embodiment is an application of the first embodiment in which a rod-like optical member 40 serving as a multiple light source forming means is used instead of the fly-eye lens 4 shown in the first embodiment.

As shown in FIG. 7, a light beam from a light source 1 forms a light source image at a second focal position $A_1$ upon being focused by an elliptical mirror 2 serving as a rotationally symmetric reflecting mirror and is incident on a re-imaging optical system 30. The re-imaging optical system 30 is constituted by a first refocusing lens 31 and a second refocusing lens 32. The first refocusing lens 31 has a front focal position corresponding to the light source image position $A_1$ and converts the light beam focused by the elliptical mirror 2 into a parallel beam. The second refocusing lens 32 focuses the parallel beam converted through the first refocusing lens 31 to form another light source image at a rear focal position $A_3$ of the second refocusing lens 32, thereby guiding the light beam to the rod-like optical member 40.

An incident surface 40a of the rod-like optical member 40 corresponds to the light source image position $A_3$ where the light source image is refocused by the re-imaging optical system 30. A plurality of light source images (virtual images) are formed substantially at the position $A_3$ on the incident surface 40a by internal reflection of the rod-like optical member 40. A plurality of light beams formed by the rod-like optical member 40 are guided to a focusing lens 42 serving as a focusing optical system.

The focusing lens 42 has a front focal position corresponding to an exit surface 40b of the rod-like optical member 40 and focuses the light beams from the rod-like optical member 40 to form a plurality of light source images (real images) at a rear focal position $A_4$ of the focusing lens 42. An aperture stop 5 having an annular (doughnut-like) aperture is located at the position where the plurality of light source images (real images) are formed, as shown in FIG. 3.

Figure 8:
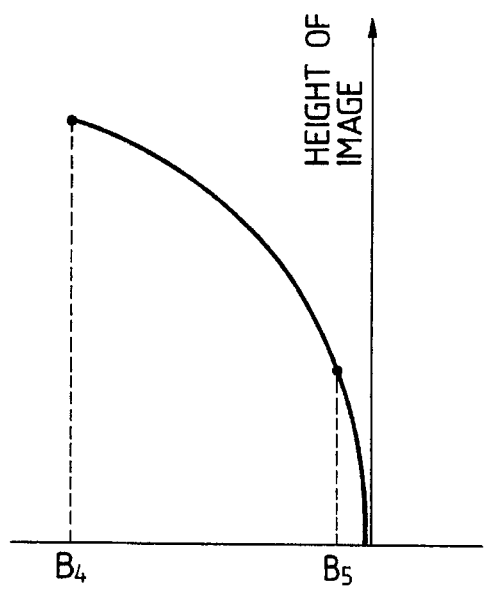
FIG. 8 is a graph showing an image forming position on the reflection surface of the elliptical mirror, which image is formed by a re-imaging optical system of the second embodiment.

The re-imaging optical system 30 has a function of curving the image of a reflection surface 2b of the elliptical mirror 2, which image is formed by the re-imaging optical system 30 between a position $B_5$ on the exit surface 40b of the rod-like optical member 40 and a position $B_4$, as shown in FIG. 8 showing the image forming positions of the reflection surface 2b of the elliptical mirror 2. For better understanding, FIG. 7 shows the image forming positions of the reflection surface 2b of the elliptical mirror 2 in a state wherein the light beam internally reflected by the rod-like optical member 40 is developed to form an image on a virtual plane P (a plane along the exit surface 40b of the rod-like optical member), as indicated by a chain line in FIG. 1. However, the image forming position of the reflection surface 2b of the elliptical mirror 2 along the optical axis, which is actually formed from the inside of the rod-like optical member 40 to the exit surface is the same as the developed state indicated by the chain line in FIG. 1.

In this embodiment, as shown in FIG. 7, the first refocusing lens 31 mainly has the function of curving the image of the reflection surface 2b of the elliptical mirror 2 with respect to the exit surface 40b of the rod-like optical member 40. However, the second refocusing lens 32 may mainly have this function, or both of the refocusing lenses 31 and 32 may share the function of curving the image.

As described above, the re-imaging optical system 30 focuses the light beam reflected on a ring-like reflection region a nearest the aperture of the elliptical mirror 2 at a position $B_5$ on the exit surface 40b of the rod-like optical member 40. The image of the ring-like reflection region a is formed at the position $B_5$ on the exit surface 40b of the rod-like optical member 40. At the same time, the re-imaging optical system 30 focuses the light beam, reflected by a peripheral ring-like reflection region b farthest from the aperture 2b of the elliptical mirror 2, at a position $B_4$ far from the position $B_4$ on the exit surface 40b of the rod-like optical member 40 along the optical axis. The image of the ring-like reflection region b is formed at the position $B_4$ far from the position $B_5$ on the exit surface 40b of the rod-like optical member 40 along the optical axis.

Figure 9A:
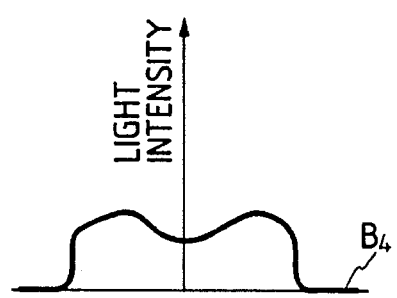
FIG. 9A is a graph showing a light intensity distribution at a position where an image of a ring-like reflection region farthest from the aperture of the elliptical mirror is formed by the re-imaging optical system of the second embodiment.
Figure 9B:
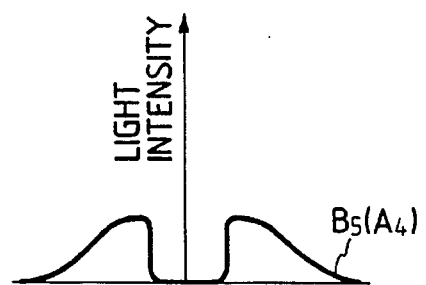
FIG. 9B is a graph showing a light intensity distribution at a position where an image of the ring-like reflection region nearest the aperture of the elliptical mirror is formed by the re-imaging optical system of the second embodiment.

As a result, the light beam at the position $B_4$ where the image of the ring-like reflection region b farthest from the aperture 2a of the elliptical mirror 2 is formed by the re-imaging optical system 30 has a light intensity distribution whose central portion is depressed, as shown in FIG. 9A. The light beam at the position $B_5$ where the image of the ring-like reflection region a nearest the aperture 2a of the elliptical mirror 2 is formed by the re-imaging optical system 30 becomes an annular light beam having a light intensity distribution having a hollow center and moderate tails, as shown in FIG. 9B. The secondary light source images (real images) formed again at the position $A_4$ by cooperation of the rod-like optical member 40 and the focusing lens 42 also have substantially the light intensity distribution having the hollow center and the moderate tails, as shown in FIG. 9B. This light intensity can maximize the effect (to be described later) of the rod-like optical member 40 for illuminance uniformity at a reticle R as a target object. The secondary light source images formed by cooperation of the rod-like optical member 40 and the focusing lens 42 form an secondary light source having a size corresponding to the size of the annular aperture of the aperture stop 5.

Figure 9C:
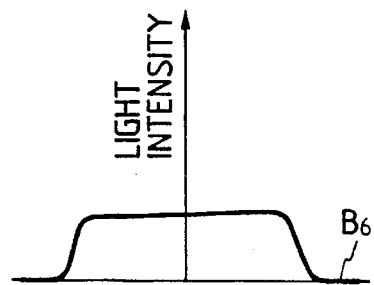
FIG. 9C is a graph showing a light intensity distribution on a reticle.

The annular light beam from this secondary source passes through the aperture stop 5 and is focused by a condenser lens 6 to obliquely illuminate the reticle R as the target object so as to superpose secondary source images. In this case, the light intensity distribution on the reticle R becomes uniform, as shown in FIG. 9C. It is readily understood that the reticle R is uniformly illuminated.

Also in the second embodiment, as in the first embodiment, since the annular secondary source can be formed without shielding the light beam, annular illumination at a very high illumination efficiency can be achieved. When the apparatus of the second embodiment is applied to the semiconductor manufacturing exposure apparatus shown in FIG. 1, a micropattern can be transferred to the wafer W at a larger focal depth while realizing a high throughput.

The rod-like optical member 40 of this embodiment uses the internal reflection of the rod-like optical member. A reflection increasing film or the like may be deposited on the optical member 40 to increase the reflection efficiency. A reflection surface may be formed on the inner wall of the hollow rod-like member.

Figure 6:
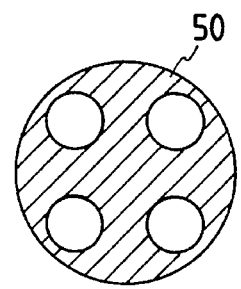
FIG. 6 is a plan view showing a state in which four circular apertures are formed in an aperture stop.

Also in the second embodiment, for example, an aperture stop 50 having four circular apertures shown in FIG. 6 may be arranged in place of the aperture stop 5 having an annular aperture as shown in FIG. 3. In this case, special oblique illumination at a higher illumination efficiency than that of the conventional system can be achieved.

The third embodiment of the present invention will be described with reference to FIGS. 10A and 10B below. The third embodiment shown in FIGS. 10A and 10B exemplifies an illuminating optical apparatus suitable for a semiconductor manufacturing exposure apparatus. In the third embodiment, a turret plate 51 having a plurality of aperture stops is arranged in place of the aperture stop 5 of the first embodiment shown in FIG. 1, and collimator lenses 3a and 3b are provided to be interchangeable in accordance with the shapes of the apertures of the plurality of aperture stops. The collimator lens 3a has the same optical characteristic as the collimator lens 3 shown in the first embodiment.

Figure 10A:
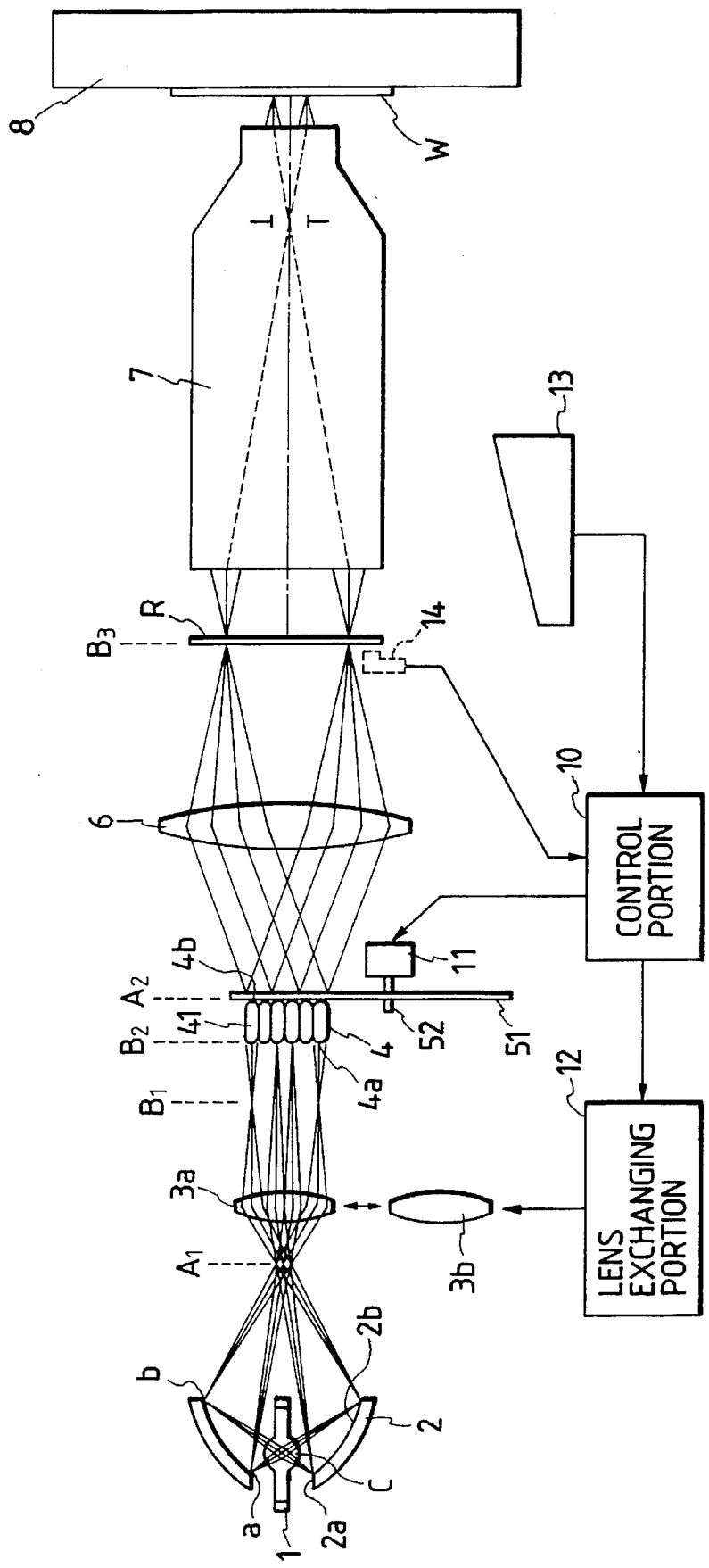
FIG. 10A is a view showing an arrangement in an oblique illumination state according to the third embodiment of the present invention.

The same reference numerals as in FIG. 1 denote the same parts in FIGS. 10A and 10B. FIG. 10A shows an oblique illumination state as in the first embodiment shown in FIG. 1. FIG. 10B shows a normal illumination state as in the conventional system.

Figure 11:
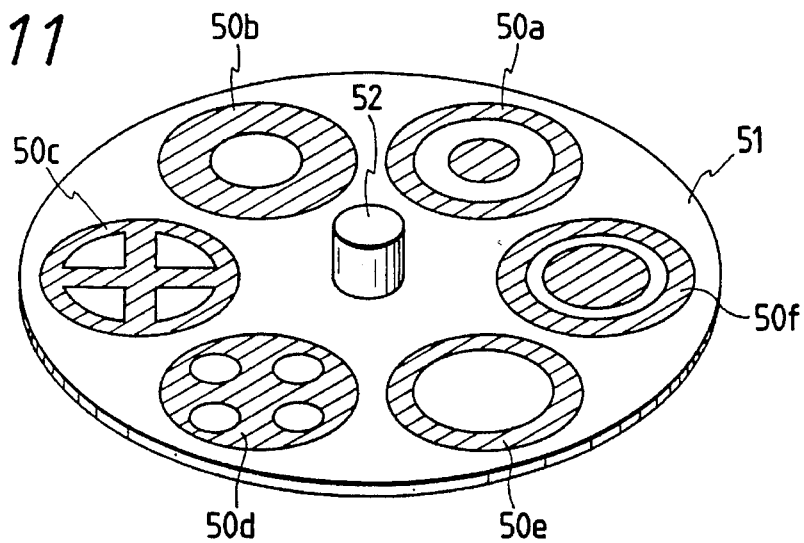
FIG. 11 is a schematic view showing an arrangement of a turret type stop according to the third embodiment.

The turret plate 51 having the plurality of aperture stops can be rotated about a predetermined shaft 52, as shown in FIG. 11. Aperture stops 50a to 50f having different aperture shapes are provided on the turret plate 51. The aperture stop 50a has an annular (doughnut-like) aperture. The aperture stops 50b and 50e respectively have circular apertures having different diameters. The aperture stop 50c has four sectorial apertures. The aperture stop 50d has four circular apertures. The aperture stop 50f has an annular ratio (ratio of the outer diameter to the inner diameter of an annular aperture) different from that of the aperture stop 50a.

Referring to FIG. 10A, selection information of a method for illuminating a reticle R is input by an input portion 13. In this embodiment, "first annular illumination", "second annular illumination", "first normal illumination", "second normal illumination", "first special oblique illumination", and "second special oblique illumination" can be selected. This selection information is transmitted to a control portion 10. The control portion 10 controls a driving portion 11 for rotating the turret plate 51 and a lens exchanging portion 12 for changing the collimator lenses 3a and 3b on the basis of the selection information from the input portion 13. The operation of the control portion 10 will be described below in detail.

Assume that the initial state is oblique illumination shown in FIG. 10A. At this time, the aperture 50a of the turret plate 51 shown in FIG. 11 is located at a position $A_2$ of a plurality of light source images.

To switch the illumination state on the reticle R to normal illumination, selection information of the "first normal illumination" or "second normal illumination" is input to the input portion 13. The "first normal illumination" and the "second normal illumination" are different in the a value (represented by $\sigma=NA_1/NA_2$ where $NA_1$ is the numerical aperture of illumination light systems 1 to 6, and $NA_2$ is the numerical aperture of a projecting optical system 7).

For example, when selection information of the "first normal illumination" is input to the input portion 13, the control portion 10 drives the driving portion 11 on the basis of the selection information to cause the turret plate 51 to be rotated such that the aperture stop 50e is located at the position $A_2$ of the plurality of light source images. When selection information of the "second normal illumination" is input to the input portion 13, the control portion 10 drives the driving portion 11 on the basis of the selection information such that the aperture stop 50b is located at the position $A_2$ of the plurality of light source images. The control portion 10 then controls the lens interchanging portion 12 such that the collimator lens 3b is located instead of the collimator lens 3a on the optical path of the illuminating optical system.

The optical characteristics of the collimator lens 3b will be described with reference to FIG. 10B. Referring to FIG. 10B, a light beam from a light source 1 forms a light source image at a second focal position $A_1$ of an elliptical mirror 2 upon being focused by the elliptical mirror 2, and is incident on the collimator lens 3b. The collimator lens 3b has a front focal point at the light source image position $A_1$ and converts the light beam from the light source image position $A_1$ into a parallel beam. The image of a reflection surface 2b of the elliptical mirror 2 is formed at a position B, far from an incident surface 4a of a fly-eye lens 4. The image of the reflection surface 2b is defocused on the incident surface 4a of the fly-eye lens 4, and a light intensity distribution having no hollow center is obtained. Therefore, a plurality of secondary light source images uniformly aligned are formed at the exit side position $A_2$ of the fly-eye lens 4. The light beams from the plurality of secondary light source images pass through the aperture stop 50e on the turret plate 51 and are focused by a condenser lens 6 to uniformly illuminate the reticle R as the target object so as to superpose the secondary source images. The image of the reflection surface 2b formed by the collimator lens 3b is satisfactorily formed at a position far from the incident surface 4a of the fly-eye lens 4. The image of the reflection surface 2b may be curved or flat.

To switch the illumination state on the reticle R from normal illumination shown in FIG. 10B to oblique illumination, selection information of the "first annular illumination", the "second annular illumination", the "first special oblique illumination", or the "second special oblique illumination" is input to the input portion 13. The "first annular illumination" and the "second annular illumination" are different in the annular ratio of the secondary source formed in an annular shape. The "first special oblique illumination"

and the "second special oblique illumination" are different in the secondary source distribution. More specifically, the secondary light source images in the "first special oblique illumination" are distributed in four sectorial regions. The secondary light source images in the "second special oblique illumination" are distributed in four circular regions.

For example, when the "first annular illumination" is selected, the control portion 10 controls the driving portion 11 to rotate the turret plate 51 such that the aperture stop 50a is located at the position $A_2$ of the plurality of light source images. When the "second annular illumination" is selected, the control portion 10 controls the driving portion 11 to rotate the turret plate 51 such that the aperture stop 50f is located at the position $A_2$ of the plurality of light source images. When the "first special oblique illumination" is selected, the control portion 10 controls the driving portion 11 to rotate the turret plate 51 such that the aperture stop 50c is located at the position $A_2$ of the plurality of light source images. When the "second special oblique illumination" is selected, the control portion 10 controls the driving portion 11 to rotate turret plate 51 such that the aperture stop 50d is located at the position $A_2$ of the plurality of light source images. The control position 10 then controls the lens exchanging portion 12 to change the collimator lens 3b to the collimator lens 3a. By using the collimator lens 3a, the image of the reflection surface 2b of the elliptical mirror 2 is curved between a position $B_2$ on the incident surface 4a of the fly-eye lens 4 and position B. Since the fly-eye lens 4 forms an almost annular secondary source, oblique illumination with a high light amount efficiency can be performed.

In the third embodiment described above, the illumination method is selected through the input portion 13. However, as indicated by a broken line in FIG. 10A, a detecting portion 14 for reading information on the reticle R may be provided. In this case, information about the illumination method is recorded by a bar code or the like at a position outside the circuit pattern region of the reticle R. The detecting portion 14 reads the information about the illumination method and transmits it to the control portion 10. The control portion 10 controls the driving portion 11 and the lens interchanging portion 12 on the basis of the information about the illumination method as described above.

In the third embodiment, the optical characteristics of the collimator lens for converting the light beam from the light source into a parallel beam are changed in accordance with switching between normal illumination and oblique illumination, thereby improving illumination efficiency in both normal illumination and oblique illumination.

In the third embodiment described above, the plurality of secondary light source images are formed by using the fly-eye lens 4. However, instead of the fly-eye lens 4, a rod-like optical member 40 as in the second embodiment may be used. In this case, the focusing characteristics of the re-imaging optical system for re-imaging the light source image by the elliptical mirror may be changed, although, in the third embodiment, the collimator lenses 3a and 3b having different focusing characteristics can be switched. To change the focusing characteristics of the re-imaging optical system, an arrangement can be proposed in which a plurality of re-imaging optical systems having different focusing characteristics can be switched, or some of the lens elements of the re-imaging optical system may be moved to change the focusing characteristics.

In the third embodiment described above, the collimator lenses 3a and 3b having different focusing characteristics can be switched. However, when each of the collimator lenses 3a and 3b is constituted by a plurality of lens elements, the focusing characteristics may be changed by moving some of its lens elements.

In the embodiments described above, the aperture stop is arranged at the position where the annular secondary source is formed. However, as can be easily understood from the principle of the present invention, the aperture stop is not essential to the present invention.

In the embodiments described above, the light-shielding portion of the aperture stop does not transmit the illumination light at all. However, the light-shielding portion may have a predetermined transmittance. In this case, the projection image contrast can be improved for only a specific micropattern.

Although the above embodiments intend to reveal the technical contents of the present invention, the present invention is not limited to the particular embodiments described above, and various changes and modifications are deemed to lie within the spirit of the invention and the scope of the appended claims.

What is claimed is:

1. An illumination optical system comprising:

a light source;

a rotationally symmetric reflecting mirror having a first aperture and a second aperture spaced along an optical axis;

a collimating optical system;

an optical integrator; and a condenser optical system;

wherein said illumination optical system is constructed so that light from said light source is reflected from said reflecting mirror, emanates from said second aperture and passes through said collimating optical system to be converted into substantially collimated light, thereafter the collimated light enters said optical integrator and passes through said optical integrator to form a plurality of light source images, and thereafter light from said light source images passes through said condenser optical system; and wherein said collimating optical system forms an image of a reflection region of said reflecting mirror nearest to said first aperture substantially at a position of an incident surface of said optical integrator and forms an image of a reflection region of said reflecting mirror nearest to said second aperture at a position distant from the position of said incident surface in an optical axis direction.

2. An illumination optical system according to claim 1, further comprising:

a stop disposed adjacent to an exit surface of said optical integrator.

3. An illumination optical system according to claim 2, wherein said stop has an annular aperture.

4. An illumination optical system according to claim 2, wherein said stop has at least two eccentrically disposed apertures.

5. An illumination optical system comprising:

a light source;

a rotationally symmetric reflecting mirror having a first aperture and a second aperture spaced along an optical axis;

a re-imaging optical system;

a rod-like optical integrator;

an imaging optical system; and a condenser optical system;

wherein said illumination optical system is constructed so that light from said light source is reflected from said reflecting mirror, emanates from said second aperture and passes through said re-imaging optical system to enter said rod-like optical integrator, in the vicinity of an incident surface of which a plurality of light source images are formed, and thereafter light from said rod-like optical integrator passes through said imaging optical system to form further images of said plurality of light source images, light from said further images entering said condenser optical system; and wherein said re-imaging optical system forms an image of a reflection region of said reflecting mirror nearest to said first aperture substantially at a position of an exit surface of said rod-like optical integrator and forms an image of a reflection region of said reflecting mirror nearest to said second aperture at a position distant from the position of said exit surface in an optical axis direction.

6. An illumination optical system according to claim 5, further comprising:

a stop disposed at a position where said images of said plurality of light source images are formed.

7. An illumination optical System according to claim 6, wherein said stop has an annular aperture.

8. An illumination optical system according to claim 6, wherein said stop has at least two eccentrically disposed apertures.

9. An illumination optical system comprising:

a light source;

a rotationally symmetric reflecting mirror having a non-reflection region, a reflection region and an aperture disposed sequentially along an optical axis;

a collimating optical system;

an optical integrator; and a condenser optical system;

wherein said illumination optical system is constructed so that light from said light source is reflected from said reflection region, emanates from said aperture and passes through said collimating optical system to be converted into substantially collimated light, thereafter the collimated light enters said optical integrator and passes through said optical integrator to form a plurality of light source images, and thereafter light from said light source images passes through said condenser optical system; and wherein said collimating optical system forms an image of a portion of said reflection region nearest to said non-reflection region substantially at a position of an incident surface of said optical integrator and forms an image of a portion of said reflection region nearest to said aperture at a position distant from the position of said incident surface in an optical axis direction.

10. An illumination optical system comprising:

a light source;

a rotationally symmetric reflecting mirror having a non-reflection region, a reflection region and an aperture disposed sequentially along an optical axis;

a re-imaging optical system;

a rod-like optical integrator;

an imaging optical system; and a condenser optical system;

wherein said illumination optical system is constructed so that light from said light source is reflected from said reflection region, emanates from said aperture and passes through said re-imaging optical system to enter said rod-like optical integrator, in the vicinity of an incident surface of which a plurality of light source images are formed, and thereafter light from said rod-like optical integrator passes through said imaging optical system to form further images of said plurality of light source images, light from said further images entering said condenser optical system; and wherein said re-imaging optical system forms an image of a portion of said reflection region nearest to said non-reflection region substantially at a position of an exit surface of said rod-like optical integrator and forms an image of a portion of said reflection region nearest to said aperture at a position distant from the position of said exit surface in an optical axis direction.

11. An exposure apparatus comprising:

an illumination optical system; and a projection optical system;

said illumination optical system having:

a light source;

a rotationally symmetric reflecting mirror having a first aperture and a second aperture spaced along an optical axis;

a collimating optical system;

a fly-eye lens; and a condenser optical system;

wherein said illumination optical system is constructed so that light from said light source is reflected from said reelecting mirror, emanates from said second aperture and passes through said collimating optical system to he converted into substantially collimated light, thereafter the collimated light enters said fly-eye lens and passes through said fly-eye lens to form a plurality of light source images, and thereafter light from said light source images passes through said condenser optical system; and wherein said collimating optical system forms an image of a reflection region of said reflecting mirror nearest to said first aperture substantially at a position of an incident surface of said fly-eye lens and forms an image of a reflection region of said reflecting mirror nearest to said second aperture at a position distant from the position of said incident surface in an optical axis direction.

12. An exposure apparatus comprising:

an illumination optical system; and a projection optical system;

said illumination optical system having:

a light source;

a rotationally symmetric reflecting mirror having a first aperture and a second aperture spaced along an optical axis;

a re-imaging optical system;

a rod-like optical integrator;

an imaging optical system; and a condenser optical system;

wherein said illumination optical system is constructed so that light from said light source is reflected from said reflecting mirror, emanates from said second aperture and passes through said re-imaging optical system to enter said rod-like optical integrator, in the vicinity of an incident surface of which a plurality of light source images are formed, and thereafter light from said rod-like optical integrator passes through said imaging optical system to form further images of said plurality of light source images, light from said further images entering said condenser optical system; and wherein said re-imaging optical system forms an image of a reflection region of said reflecting mirror nearest to said first aperture substantially at a position of an exit surface of said rod-like integrator and forms an image of a reflection region of said reflecting mirror nearest to said second aperture at a position distant from the position of said exit surface in an optical axis direction.

* * * * *